United States Patent
Lalli et al.

(10) Patent No.: US 7,396,569 B2
(45) Date of Patent: Jul. 8, 2008

(54) RAPIDLY SELF-ASSEMBLED THIN FILMS AND FUNCTIONAL DECALS

(75) Inventors: Jennifer Hoyt Lalli, Blacksburg, VA (US); Jiyun Huie, Methuen, MA (US); Ben Lepene, Christiansburg, VA (US)

(73) Assignee: NanoScale Materials, Inc., Christianburg, VA (US)

(*) Notice: Subject to any disclaimer, the term of this patent is extended or adjusted under 35 U.S.C. 154(b) by 0 days.

(21) Appl. No.: 10/774,683

(22) Filed: Feb. 10, 2004

(65) Prior Publication Data

US 2005/0064204 A1 Mar. 24, 2005

Related U.S. Application Data

(60) Provisional application No. 60/446,124, filed on Feb. 10, 2003.

(51) Int. Cl.
*B05D 1/36* (2006.01)
(52) U.S. Cl. .................. 427/409; 427/387; 427/388.4; 427/393.5
(58) Field of Classification Search .............. 428/423.1; 427/384, 387, 388.1, 388.2, 388.4, 393.5, 427/407.1, 409, 404
See application file for complete search history.

(56) References Cited

U.S. PATENT DOCUMENTS

| | | | | |
|---|---|---|---|---|
| 6,025,202 | A * | 2/2000 | Natan | 436/104 |
| 6,242,264 | B1 * | 6/2001 | Natan et al. | 436/171 |
| 6,592,945 | B2 * | 7/2003 | Suzuki et al. | 427/387 |
| 6,624,886 | B2 * | 9/2003 | Natan et al. | 356/301 |
| 2004/0235997 | A1 * | 11/2004 | Meisenburg et al. | 524/431 |

* cited by examiner

*Primary Examiner*—Thao Tran
(74) *Attorney, Agent, or Firm*—Sherr & Nourse, PLLC (57) ABSTRACT

The present invention relates to methodologies for the self-assembly of nanoparticles onto a release support that is capable of covalent integration into flexible free-standing films. Such films display usefull constitutive properties, such as permittivity, permeability, electrical conductivity, thermal conductivity, and nonlinear optic properties. The type of property is dependant upon the type of nanoparticle incorporated into the compliant polymeric matrix. The compliant matrix may be any material that reacts with the components in the nanoparticle film and may be separated from the release substrate. The nanoparticles may be dispersed uniformly or spatially patterned throughout the self-assembled film.

18 Claims, 6 Drawing Sheets

RAPIDLY SELF-ASSEMBLED THIN FILMS AND FUNCTIONAL DECALS

CROSS REFERENCE TO RELATED APPLICATIONS

The present invention is related to and claims the benefit of provisional patent application Ser. No. 60/446,124, filed 10 Feb. 2003, which is expressly incorporated fully herein by reference in its entirety.

FIELD OF THE INVENTION

The present invention relates to methodologies for the self-assembly of nanoparticles onto a release support that is capable of covalent integration into flexible free-standing films. Such films display useful constitutive properties, such as permittivity, permeability, electrical conductivity, thermal conductivity, and nonlinear optic properties. The type of property is dependant upon the type of nanoparticle incorporated into the compliant polymeric matrix. The compliant matrix may be any material that reacts with the components in the nanoparticle film and may be separated from the release substrate. The nanoparticles may be dispersed uniformly or spatially patterned throughout the self-assembled film.

BACKGROUND OF THE INVENTION

Recent advances in technology have increased the demand for improved nanocomposite material processing with strict tolerances on processing parameters. For example, current integrated circuit technology already requires tolerances on processing dimensions on a submicron scale. Self-assembly approaches have been developed for the fabrication of very thin films of composite materials. These self-assembly processes, however, while highly advantageous, generally are limited with respect to the types of materials that can be deposited by a particular process, by costs and manufacturing facilities.

Presently, nanocomposite materials are manufactured in large manufacturing facilities that are expensive to build and to operate. For example, semiconductor device fabrication generally requires specialized microlithography and chemical etching equipment as well as extensive measures to avoid process contamination. Furthermore, the fabrication processes typically used to create electronic and electromechanical components involve harsh conditions, such as high temperatures and/or caustic chemicals. In addition, high temperatures also preclude fabrication on substrates such as flexible plastics, which offer widespread availability and lower costs.

Presently, there is a serious drawback associated with using polymer materials in the thin film due to their susceptibility to marring and scratching by physical contact with harder materials. Continuous marring and scratching result in impaired visibility and poor aesthetics, and often requires replacement of the plastic components.

Several techniques to improve the abrasion wear resistance of plastic substrates use coating solutions which may be spread onto the desired plastic substrates by dip, spray, spin, or flow techniques. The resulting coatings generally offer significant improvement of abrasion-resistance, but generally exhibit flow marks on the surface and an uneven coating thickness distribution that may cause undesirable optical aberrations.

Other techniques for forming abrasion-resistant coatings involve spin dip, spray or flow methods to form abrasion resistant coatings on smooth surfaces such as optical elements in spectacle lenses. The build-up of the coating material at the outer edge of the lens, however, can cause optical aberration. These techniques are even less satisfactory when they are used to coat irregular surfaces. Moreover, the application of many of the prior abrasion resistance coatings require thermally activated initiators so the plastic substrates must be exposed to elevated temperature in order to fully develop the physical properties of the coating and to remove the solvents. Such high temperature processing may significantly degrade the quality of the plastic, through the incorporation of residual stresses.

Vapor deposition techniques for coating application have also been employed. The technique typically involves the vapor deposition of a top layer of silicon dioxide onto an intermediate layer of an acrylate-type polymer that has, in turn, been coated onto a polycarbonate substrate. This evaporative technique of applying a layer of silicon dioxide, however, is often undesirable for several reasons, including (i) insufficient bond strength between the silicon dioxide layer and the underlying polymer layer, (ii) the resulting non-uniform surface is often characterized by pinholes, pits, and other imperfections, (iii) the difficulty to obtain uniformly thick coatings on curved or irregular or large-size substrates, (iv) the significant degradation of the plastic due to its exposure to high temperature, and (v) the spalling and cracking that occurs when the film thickness is increased beyond approximately 0.5 micrometer.

Accordingly, it is one object of the present invention to provide methodologies to lessen the disadvantages associated with the fabrication of nanocomposite materials.

SUMMARY OF THE INVENTION

The present invention relates to the rapid self-assembly of nanoparticles onto a substrate that is capable of covalent integration into free-standing, mechanically robust films. In one aspect, the present invention relates to a Layer by Layer Covalent Self Assembly (LbL CSA) methodology that allows for discrete control over the thickness of the nanoparticle layers and allows for molecular control over multifunctional graded coatings. Additionally, the present invention pertains to a removable free-standing smart film or decal which covalently transfers the deposited nanoparticle layer from the substrate to the compliant film; the pattern and properties of the nanoparticle remain intact following the transfer.

Unlike other traditional methods for film deposition, such as vacuum evaporation, chemical vapor deposition, or sputtering, the present invention provides methodologies for the fabrication of flexible thin nanocomposite films that overcome the limitations associated with these methods. Accordingly, the layer-by-layer covalent self-assembly methods and rapid self assembly methods of the present invention are cost effective (no special equipment is necessary, such as high vacuum chamber), benign and simple (solution based chemistry at ambient conditions), and highly reproducible (since the self-assembly process takes place in order to reach the system's thermodynamic minimum). Indeed, the methodologies of the present invention do not require stringency, but rather use readily available materials, either synthetically or commercially, in an ambient lab setting that can yield the desired final product. Additionally, the present invention discloses a covalent atom transfer (CAT) methodology that allows for the fabrication of abrasion resistant coatings on both rigid and flexible nanocomposite thin films.

Thus, the CAT methodology of the present invention allows for the fabrication of nanocomposite thin films that offer significant improvements over films formed by the methods described above. For example, the CAT method allows for the construction of decals that have the ability to exhibit highly conductive (close to that of bulk metal) surfaces that do not wipe off. The CAT methodology of the present invention is relatively simple to perform and is very cost effective relative to the common metal deposition methods, such as magnetron sputtering, and chemical vapor deposition.

In a first aspect, the invention pertains to methods for producing a nanocomposite film by constructing a plurality of alternating layers of a nanoparticle layer and a cross linker layer onto a substrate. Additionally, a polymer layer may be included in the nanocomposite film. In one aspect, the polymer layer may be deposited onto the nanoparticle layer. In another aspect, the polymer layer may be deposited onto the crosslinker layer. The polymer may be any organosilane.

In another aspect, the invention pertains to nanocomposite films comprising nanoparticles which may include, but are not limited to, metallic nanoparticles, semiconducting nanoparticles, magnetic nanoparticles, ceramic nanoparticles, dielectric nanoparticles and any combination thereof. The metallic nanoparticles may comprise a gold nanoparticle, a gold alloy nanoparticle, a gold core shell nanoparticle, a silver nanoparticle, a silver alloy nanoparticle, a silver core shell nanoparticle, a platinum nanoparticle, a platinum alloy nanoparticle, a platinum core shell nanoparticle, a palladium nanoparticle, a palladium alloy nanoparticle, a palladium core shell nanoparticle, a copper nanoparticle, a copper alloy nanoparticle, a copper core shell nanoparticle, and any combination thereof.

Also, the present invention pertains to substrates which may include, but are not limited to glass slide, single crystal silicon, polycarbonate, kapton, polyethylene rigid polymer materials, flexible polymer materials, ceramics, metal surfaces, etched surfaces, functionalized surfaces, and non-functionalized surfaces. In one aspect of the present invention, the substrates may be functionalized prior to nanoparticle deposition by using an adhesion promoting agent, etching, or by any method known by one skilled in the art. In another aspect, the substrate is not functionalized prior to nanoparticle deposition.

In addition, the present invention relates to the nanocomposite films comprising a crosslinking layer. The crosslinkers of the present invention are any material that has at least two functional groups. The crosslinker functional groups may include, but are not limited to, hydroxyl groups, amino groups, carboxyl groups, carboxylic acid anhydride groups, mercapto groups, hydrosilicon groups and any combination thereof.

In another aspect, the present invention relates to methods for fabricating a nanocomposite film by providing a substrate that has a primary layer of nanoparticles and immersing this substrate into a nanoparticle growth solution. The growth solution comprises a metal that corresponds to the nanoparticle in the primary layer and a reducing agent. The reducing agent reduces the metal onto the surface of the primary layer of nanoparticles.

In further aspects, the present invention relates to methods for transferring the nanoparticle layers from the substrate onto a film by contacting the nanocomposite film with an abrasion resistant compliant resin, and curing the abrasion resistant compliant resin on the nanocomposite film. In an additional aspect, the transfer method may include removing the resinous coating from the substrate.

Also, the present invention pertains to abrasion resistant resins that may comprise functional groups capable of reacting with the nanoparticle ligands. In a more specific aspect, the abrasion resistant resins may include, but are not limited to, thermosetting resins, photosetting resins, phenolformaldehyde, phenol resins, epoxy resins, polysiloxane resins, polyurethane, and poly(etherurethane) resins.

In another aspect, the present invention relates to nanocomposite films comprising the properties of a Young's modulus in the range of about 0.01 MPa to about 200 MPa, an electrical bulk conductivity in the range of about $1\times10^{-3}$ $\Omega^{-1}$ $m^{-1}$ to about $7\times10^{6}$ $\Omega^{-1}$ $m^{-1}$, an electrical sheet resistance in the range of about 0.1 $\Omega$/sq to about 200 $\Omega$/sq, and a thermal conductivity in the range of about 0.1 W/m ° K to about 100 W/m ° K. In a further aspect, the nanocomposite films of the present invention may be used as electrically conducting electrodes, thermally conducting materials, optically reflecting material, strain sensors, and flexible electrical interconnects.

In a further aspect, the present invention relates to a freestanding electrically conducting electrode having a Young's Modulus in the range of about 0.01 MPa to about 200 MPa and electrical sheet resistance in the range of about 0.1 $\Omega$/sq to about 200 $\Omega$/sq. In a more specific aspect, the electrically conducting electrode has a Young's Modulus of about 20 MPa and electrical sheet resistance of about 10 $\Omega$/sq.

Also, the presenting invention relates to a free standing thermally conducting material which may comprise a Young's Modulus in the range of about 0.01 MPa to about 200 MPa and thermal conductivity in the range of about 0.1 W/m °K to about 100 W/m °K. In a more specific aspect, the thermally conducting material comprises a Young's Modulus of about 0.2 MPa and a thermal conductivity of about 2 W/m °K.

In addition aspects, the present invention relates to an optically reflecting material comprising a Young's Modulus in the range of about 0.01 MPa to about 200 MPa and an optical reflection coefficient in the range of about 1% to about 97%. In a more specific aspect, the optically reflecting material comprises a Young's Modulus of about 10 MPa and an optical reflection coefficient of about 65% at a wavelength of about 633 nm.

In another aspect, the present invention relates to a strain sensor which may comprise the properties of a Young's modulus in the range of about 0.01 MPa to about 200 MPa, an electrical bulk conductivity in the range of about $1\times10^{-3}$ $\Omega^{-1}$ $m^{-1}$ to about $7\times10^{6}$ $\Omega^{-1}$ $m^{-1}$, an electrical sheet resistance in the range of about 0.1 $\Omega$/sq to about 200 $\Omega$/sq, and a thermal conductivity in the range of about 0.1 W/m ° K to about 100 W/m ° K. In a more specific aspect, the strain sensor comprises a Young's Modulus of about 20 MPa and an electrical sheet resistance of about 10 $\Omega$/sq.

In an additional aspect, the present invention relates to a flexible electrical interconnect which may comprise the properties of a Young's modulus in the range of about 0.01 MPa to about 200 MPa, an electrical bulk conductivity in the range of about $1\times10^{-3}$ $\Omega^{-1}$ $m^{-1}$ to about $7\times10^{6}$ $\Omega^{-1}$ $m^{-1}$, an electrical sheet resistance in the range of about 0.1 $\Omega$/sq to about 200 $\Omega$/sq, and a thermal conductivity in the range of about 0.1 W/m ° K to about 100 W/m ° K. In a more specific aspect, the interconnect has a Young's Modulus of about 100 MPa and an electrical sheet resistance of about 10 $\Omega$/sq.

Other objects, features and advantages of the present invention will become apparent from the following detailed description. The detailed description and the specific examples, however, indicate only preferred embodiments of the invention. Various changes and modifications within the spirit and scope of the invention will become apparent to those skilled in the art from this detailed description.

DETAILED DESCRIPTION OF THE INVENTION

It is understood that the present invention is not limited to the particular methodology, protocols, devices, apparatus, materials, and reagents, etc., described herein, as these may vary. It is also to be understood that the terminology used herein is used for the purpose of describing particular embodiments only, and is not intended to limit the scope of the present invention. It must be noted that as used herein and in the appended claims, the singular forms "a," "an," and "the" include plural reference unless the context clearly dictates otherwise. Thus, for example, a reference to "a nanoparticle" is a reference to one or more nanoparticle and equivalents thereof known to those skilled in the art and so forth.

Unless defined otherwise, all technical and scientific terms used herein have the same meanings as commonly understood by one of ordinary skill in the art to which this invention belongs. Preferred methods, devices, and materials are described, although any methods and materials similar or equivalent to those described herein can be used in the practice or testing of the present invention. All references cited herein are incorporated by reference herein in their entirety.

Definitions

In describing and claiming the present invention, the following terminology will be used in accordance with the definitions set out below.

The term "nanoparticle" refers to a particle, generally metallic, semiconducting, magnetic, ceramic and dielectric, having a diameter in the range of about 1 nm to about 1000 nm. The nanoparticles may be functionalized and/or naked on the particle surface. The nanoparticles may be dispersed uniformly or spatially patterned through the self-assembled film or decal.

The terms "semiconductor nanoparticle" and "semiconductive nanoparticle" refer to a nanoparticle as defined above that is composed of an organic and/or inorganic semiconductive material, an alloy or other mixture of inorganic semiconductive materials, an organic semiconductive material, or an inorganic or organic semiconductive core contained within one or more semiconductive overcoat layers.

The term "metallic nanoparticle" refers to a nanoparticle as defined above that is composed of a metallic material, an alloy or other mixture of metallic materials, or a metallic core contained within one or more metallic overcoat layers.

The terms "halo" and "halogen" are used in the conventional sense to refer to a chloro, bromo, fluoro or iodo substituent. The term "haloalkyl" refers to an alkyl group in which at least one of the hydrogen atoms in the group has been replaced with a halogen atom.

The term "polymer" is used herein in its conventional sense to refer to a compound having two or more monomer units, and is intended to include linear and branched polymers, and copolymers, the term "branched polymers" encompassing simple branched structures as well as hyperbranched and dendritic polymers. The term "monomer" is used herein to refer to compounds that are not polymeric. "Polymers" herein may be naturally occurring, chemically modified, or chemically synthesized.

The term "crosslinker" refers to linker compounds that may have one or more functional groups. One functional group of the linker may be suitable for chemically binding of a first and second molecule together. Chemical binding is considered to broadly cover bonding with some covalent character with or without polar bonding and can have properties of ligand-metal bonding along with various degrees of ionic bonding. The functional group is selected based on the composition of the molecule. Another functional group of the linker may be suitable for covalent bonding a first and second molecule together. Covalent bonding refers broadly to covalent bonds with sigma bonds, pi bonds, other delocalized covalent bonds and/or other covalent bonding types, and may be polarized bonds with or without ionic bonding components and the like. Convenient linkers include functionalized organic molecules. The crosslinkers of the present invention may comprise one or more functional groups comprising hydroxyl groups, amino groups, carboxyl groups, carboxylic acid anhydride groups, mercapto groups, and hydrosilicon groups.

The present invention includes the rapid self-assembly of nanoparticles onto a release support that is capable of covalent integration into flexible free-standing films. An embodiment of the present invention contemplates a Layer by Layer Covalent Self Assembly (LbL CSA) method which allows for discrete control over the thickness of the nanoparticle layers and allows for molecular control over multifunctional graded coatings. An alternate embodiment of the present invention relates to a Rapid Self Assembly (RSA) methodology that allows for the rapid formation of many micro-thick and multi-layered coatings.

The present invention also contemplates a removable free-standing smart film or decal which covalently transfers the deposited nanoparticle layer from the release substrate to the compliant film. This embodiment of the present invention relates to a Covalent Atom Transfer (CAT) methodology which yields robust, free-standing abrasion-resistant thin transparent films with any desired combination of properties based upon the design and thickness of the nanoparticles and permutations thereof.

A particular embodiment of the present invention relates to a methodology for the construction of organic and/or inorganic nanocomposite films composed of nanoparticles and molecular crosslinkers. The molecular crosslinkers may act as nanoparticle binders in a layer-by-layer self-assembly fashion. The cohesive multicomponent films result from the inherent attractive interaction between the nanoparticles and the crosslinking molecules that are covalent by design. A specific embodiment comprises immersing a silanized release substrate into a solution containing the desired nanoparticles for a designated time period, rinsing the substrate and then drying the substrate. The nanoparticles subsequently coat the substrate by immersing the nanoparticle coated substrate into the crosslinker solution, where adsorption of crosslinker molecules on nanoparticle surfaces occurs. In a specific embodiment, repeating the immersion, rinse and dry steps in a cyclic manner may allow for a sequential molecular build-up of organic and/or inorganic hybrid thin films.

Figure 1:
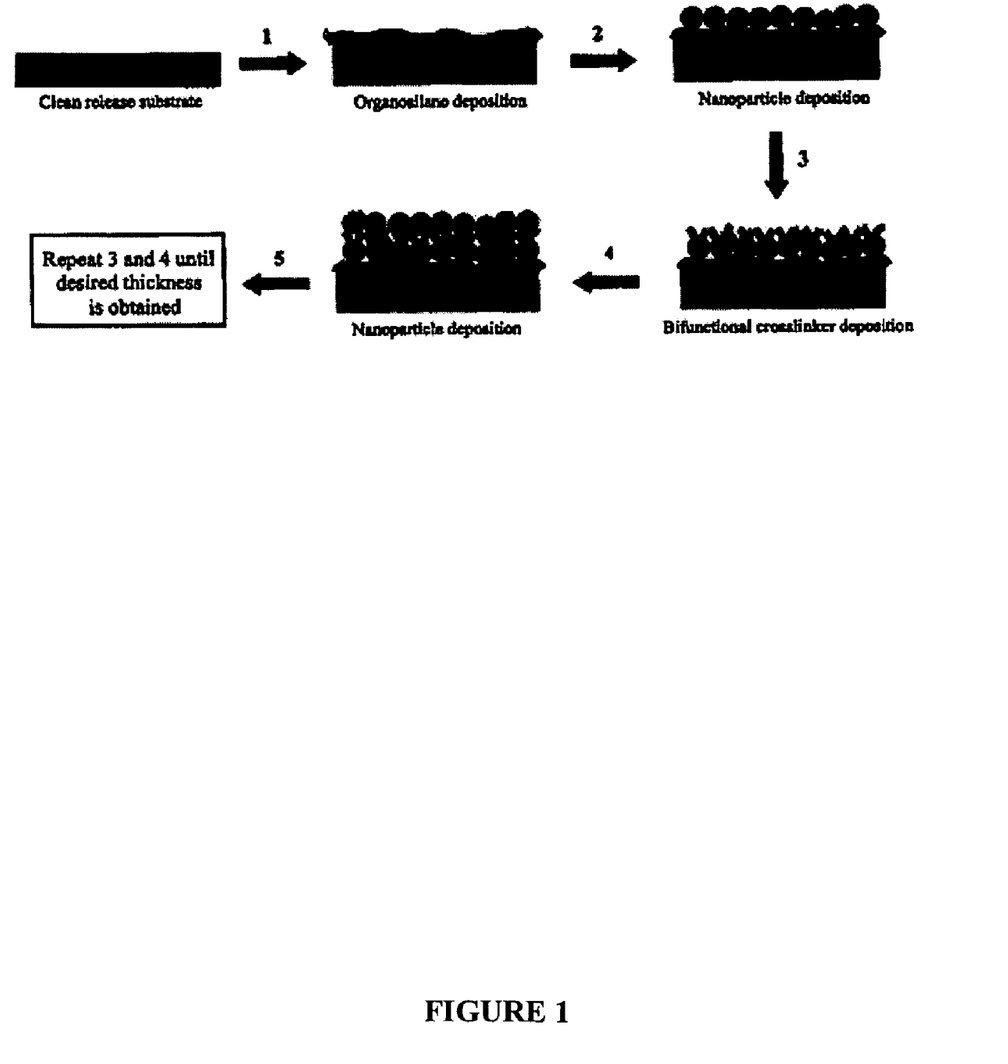
FIG. 1 provides a schematic diagram showing the layer-by-layer covalent self-assembly process to arrive at the organic and/or inorganic nanocomposite films of the present invention.

FIG. 1 illustrates an embodiment of the present invention for the fabrication of nanoparticle-crosslinker nanocomposite layers through covalent self-assembly at the molecular level. In this embodiment, the substrate 10 is cleaned and may be functionalized with an appropriate precursor 12, such as an adhesion promoting agent. In a particular embodiment, the precursor comprises an organosilane whose terminal groups may bind to the nanoparticle of interest. The substrate is immersed into a nanoparticle solution containing the nanoparticle of interest to be deposited onto the substrate. The substrate may be immersed into the nanoparticle solution in the range of about 1 minute to about 120 minutes. In a particular embodiment, the substrate is immersed into the nanoparticle solution for about 60 minutes. Following, the nanoparticle-coated substrate 14 may be rinsed and dried before immersing the into the crosslinker solution. The nanoparticle-coated substrate may be immersed into a solution containing the appropriate crosslinker. The nanoparticle-coated substrate is immersed into the crosslinker solution in the range of about 1 minute to about 30 minutes. Specifically, the nanoparticle-coated substrate is immersed into the crosslinker solution for about 10 minutes. Subsequently, crosslinking molecules 16 chemically bind to the nanoparticle surfaces on one end and leave behind the other for the subsequent layer of nanoparticles to adsorb. In this embodiment, the layer-by-layer self assembly process through covalent bonding may be repeated until the desired film thickness if achieved.

In an alternative embodiment, following crosslinker deposition, the substrate may be rinsed and dried and subsequently immersed into a polymer solution. The substrate may be immersed in the polymer solution in the range of about 1 minute to about 120 minutes. In a specific embodiment, the substrate is immersed in the polymer solution for about 60 minutes. Following immersion in the polymer solution, the substrate may be rinsed and dried. In this embodiment, the layer-by-layer self assembly process may be repeated until the desired film thickness if achieved.

Figure 2:
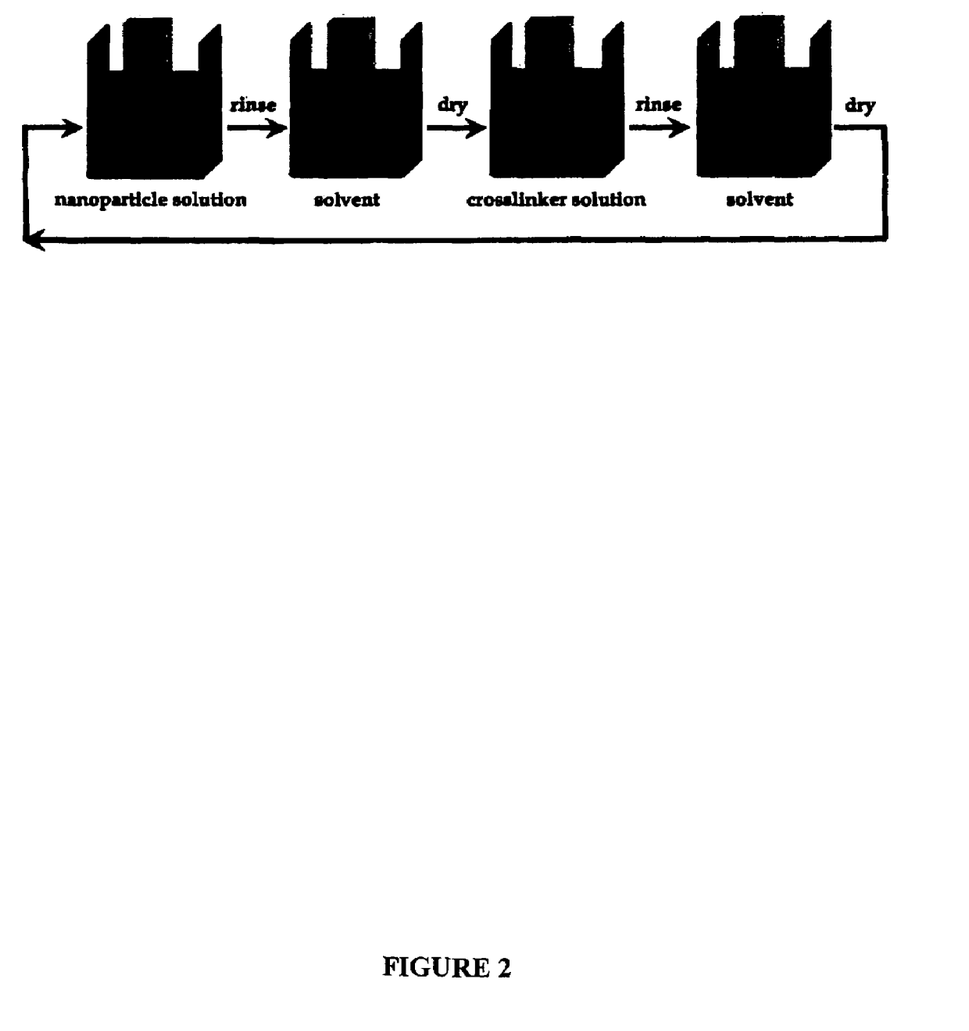
FIG. 2 provides a schematic illustration of the layer-by-layer molecular self-assembly of nanocomposite thin film.

FIG. 2 schematically illustrates the layer-by-layer self assembly method of the present invention which may used to construct an organic and/or inorganic nanocomposite film, once the organosilane functionalized substrate has been prepared. In this particular embodiment, the rinsing solvents are the same as what constitutes either the nanoparticle or crosslinker solutions. The substrate rinse between the nanoparticle and crosslinker depositions may help to avoid cross-contamination of the two solutions. In an alternate embodiment, the rinsing solvents are different as what constitutes either the nanoparticle or crosslinker solution.

Many constitutive properties of the inorganic or organic nanocomposite film may be achieved using different nanoparticles. The nanoparticles of the present invention may include, but are not limited to, metallic nanoparticles, ceramic nanoparticles, semiconducting nanoparticles, magnetic nanoparticles and dielectric nanoparticles. The nanoparticles may be functionalized and/or naked on the particle surface. The nanoparticles of the present invention have a diameter in the range of about 1 nm to about 1000 nm. The nanoparticles may be dispersed uniformly or spatially patterned through the self-assembled film or decal.

The film produced by the methodology of the present invention retains properties that are intrinsic to the type of nanoparticle used. For example, optical properties such as index of refraction, transmittance, reflectance, and absorbance of the film may be controlled via judicious selection of crosslinking molecules as well as the nanoparticle moieties.

On embodiment of the present invention is directed to the formation of electrically conductive and optically transparent nanocomposite thin films. The films of this embodiment may comprise gold nanoparticles, 2-mercaptoethanol or 2-mercaptoethylamine as the crosslinkers, and aminopropyltriethoxysilane or mercaptopropyltrimethoxysilane as the organosilane layer on the substrate, which may be glass slides, single crystalline silicon, or a polycarbonate.

The organosilane-functionalized substrate is immersed into a naked colloidal gold solution for approximately one hour, rinsed in ultra-pure water (18.3 M$\Omega$-cm), dried, and then dipped into a dilute aqueous solution of 2-mercaptoethanol or 2-mercaptoethylamine for approximately 10 minutes. The rinsing and dry steps may be repeated. The alternating immersion of the substrate into the colloidal gold and the crosslinker solution in a cyclic manner may allow for a successful buildup of multiple bilayers comprising the gold nanocluster layer and the crosslinker layer. In this conductive/transparent nanocomposite film, the gold nanoclusters constitute conductive moieties while the crosslinkers provide lateral and perpendicular molecular bridges between the gold nanoclusters.

Thickness of the self-assembled film may be controlled through the number of bilayers deposited and the size of nanoparticles. The conductivity and the optical transparency may be simultaneously manipulated (inversely related) through the chain length of the molecular crosslinkers between gold nanoparticles. For example, the shorter the effective molecular chain length, the better the conductivity of the film, but the poorer the optical transmittance through the film. These molecular bridges function as tiny circuit wires that allow for electron transport once the percolation threshold is attained. Conjugated chains may enhance this electron transporting property. A self-assembled nanocomposite film comprising 30 bilayers of gold nanoparticles and 2-mercaptoethanol as the crosslinker was found to exhibit a sheet resistance to be about 100 $\Omega$/sq.

An alternate embodiment of the present invention is related to the Rapid Self-Assembly (RSA) process for producing electrically conductive thin films, as well as films with a broader range of physical properties such as optical, mechanical, magnetic, thermal, and electrical, based on the nanoparticles incorporated into the film. In a particular embodiment, the RSA methods for fabricating a nanocomposite film include providing a substrate that has a primary layer of nanoparticles and immersing this substrate into a nanoparticle growth solution. The growth solution may comprise a metal that corresponds to the nanoparticle in the primary layer and a reducing agent. The reducing agent reduces the metal onto the surface of the primary layer of nanoparticles. The substrate may be immersed in the growth solution in the range of about 1 minute to about 60 minutes. In a particular embodiment, the substrate is immersed in the growth solution for about 30 minutes. Using the methodology encompassed by this embodiment, electrically conductive gold films on flexible and rigid polymer materials, ceramics, and metal surfaces of all shapes and sizes with sharp angles and microscopic geometries may be constructed.

The film processing conditions of this embodiment of the present invention have been provided to increase conductivity, uniformity, and to increase repeatability between fabricated samples. These process modifications allows for the construction of thin conductive metallic films with conductivities near 0.1-1 $\Omega$/sq.

The first step in this embodiment comprises the surface preparation procedure. This process comprises plasma etching in a range of about 0.2 Torr to about 0.4 Torr for about one minute and subsequent aminosilane deposition and curing. The substrate is then immersed in about a 1% triethoxypropylaminosilane (3-APS) solution for about one hour. Excess monomer is rinsed from the surface and the substrate is dried and cured in the oven for about one hour at about 50° C. The substrate is then immersed in a gold nanoparticle solution for about one hour until a dense monolayer of gold nanoparticles is absorbed onto the surface. This primary layer of gold nanoparticles acts as a nucleation sites for further gold growth as $HAuCl_4$ is reduced onto the surface.

Figure 3:
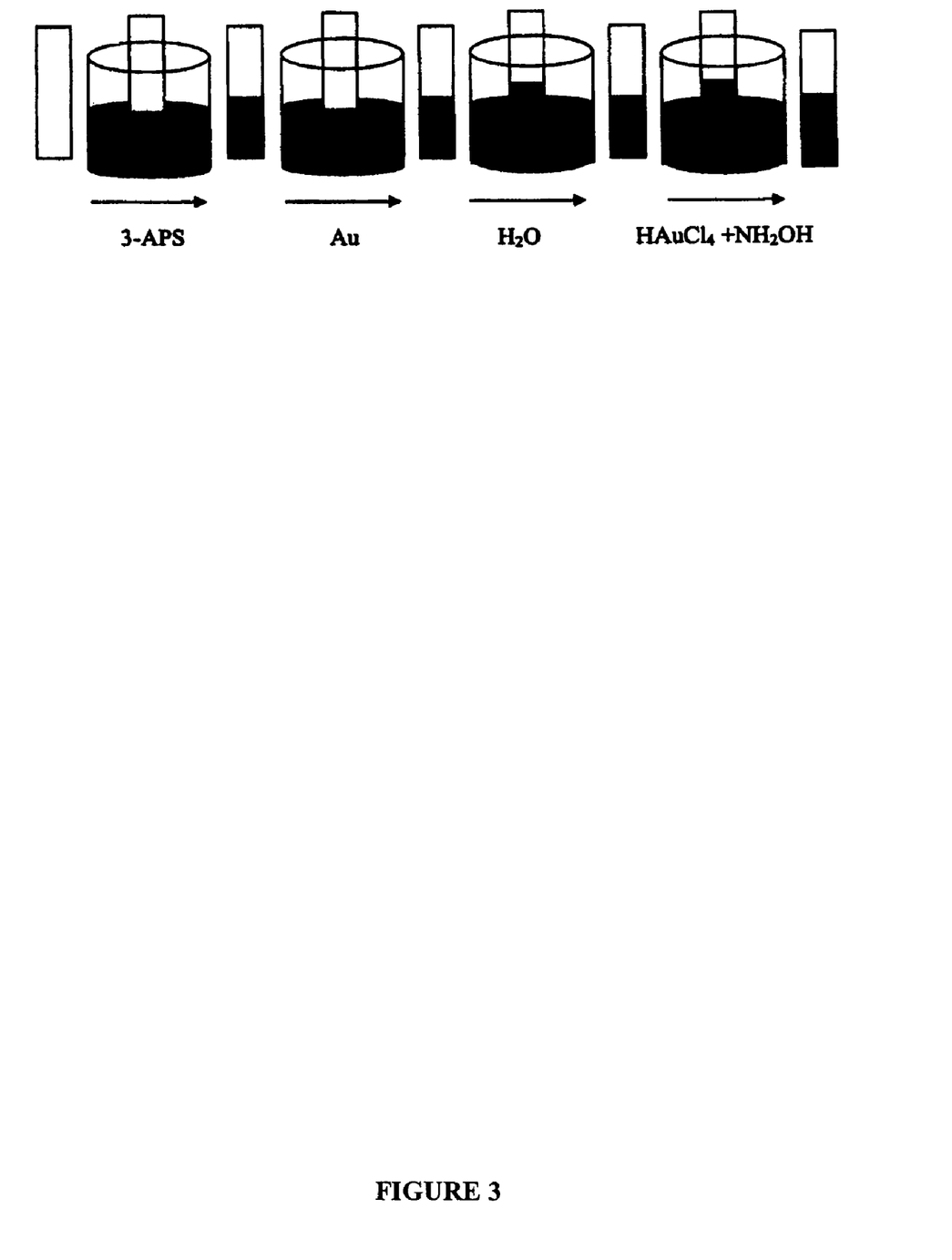
FIG. 3 provides a schematic representation of the four immersion steps involved in the rapid self assembly methodology of the present invention.

The reduced gold deposits and grows on the nanoparticle surfaces at a faster rate than new particles are nucleated resulting in the deposition of conductive films with controllable thickness instead of nucleation and growth of new particles in the aqueous solution. Using the methodology of this embodiment, film thickness and the resulting conductivity may be controlled by varying the starting material amounts, relative concentrations, and the immersion time. The resulting thickness and resistivities for electrodes prepared using this method are approximately 250 nm and 1.5 Ω/sq measured using a four-point-probe. FIG. 3 illustrates the RSA methodology of this embodiment.

In a particular embodiment, thin conductive gold coatings may be prepared on kapton and polyethylene substrates. The films produced by the methodology of this embodiment are uniform, reflective and highly conductive. Prior to ESA deposition of actuator precursor materials, atomic force microscope (AFM) images were collected to characterize the film roughness and surface properties. The maximum z-height in the representative 2×2 μm scan region is 60 nm, indicating a relatively uniform surface topography suitable for subsequent deposition of ESA precursors.

Another embodiment of the present invention is related to a Covalent Atom Transfer (CAT) method which comprises the process of reacting (and hence transferring) self-assembled nanoparticle layers from a release substrate onto removable free standing robust compliant films whereby both the pattern and smart properties of the nanoparticles remain intact. This embodiment involves three basic steps. First, nanoparticles may be self-assembled onto a release substrate using either of the above described methods (LbL CSA or RSA). Second, an abrasion resistant compliant resin may be synthesized and cast onto the nanoparticle film. Finally, the resinous coating is cured in the presence of (typically, but not necessarily on top of) the nanoparticle self assembled layers. Such transparent or opaque coatings may be (a) left on the release substrate as the abrasion resistant outermost coating or (b) removed from the release substrate and employed as free standing functional decals. Method (b) allows for covalent integration of the nanoparticles within the abrasion resistant matrix and generates decals whereby the nanoparticle layers function as the outermost coating.

The smart properties of the films may originate from the self assembly method (RSA and LbL CSA) as described above. In one embodiment, the nanoparticles may be self assembled onto the releases substrate via solution immersion or ink jet printing techniques. The latter may be used to generate 2D patterns that may be transferred to the reactive resin coating. Electrically conductive gold coatings (or other conductive metals such as Ag and Cu) represent one example of materials used in the aircraft coating industry which must remain stable under harsh environmental and mechanical conditions over a widely fluctuating temperature range. In one embodiment, the nanoparticles are "locked" into an abrasion resistant hard coating since the self assembled metallic coatings cannot independently survive flight conditions (easily wiped from the surface). The controlled properties, such as conductivity and permittivity are only limited by the choice of and the thickness of the nanoparticles incorporated films.

The removable compliant resins of the present invention may be organic, inorganic, or combinations thereof. Moreover, the reactive resins may also be a second smart material, such as a conductive, magnetic, dielectric, thermal and/or optical material. In one particular embodiment, the resin may have functional groups capable of reacting with the nanoparticle ligands and may be applied in its resinous state (uncured or partially uncured). This allows for nanoparticle entrapment within the undermost layer (or outermost layer when removed) of the compliant network. This method is not limited to crosslinked networks. Thermoplastic elastomers or other reactive monomers may be used to generate the films. The reactive resin may be applied to the nanoparticle surface by a variety of low cost techniques. Resin coating methods of the present invention include, but are not limited to, dip coating, spin coating, spraying, web based processes, ink jet printing, etc. Furthermore, decals with controlled thickness, size and shapes may be formed and layered into multicomponent films with graded properties.

Hard coating resins represent one specific example and are based on an innovative inorganic-organic hybrid nanocomposite containing molecularly monodisperse ceramic ($Al_2O_3$ and $TiO_2$) nanoparticles that may be covalently tied into the network structure. Such ceramic nanocomposites may offer the hardness required by a ceramic for good abrasion resistance without the brittleness associated with sputtered ceramic coatings. The rubber toughened ceramic compositions may lead to abrasion resistance and impact resistance as the organic portion of the ceramic nanocomposite can absorb the energy upon impact with structures in the atmosphere. Abrasion resistance is defined as the ability of a structure to withstand progressive removal of material from its surface as a result of mechanical collisions. Abrasion or surface wearing is typically improved by tailoring the desired surface to be harder than the surfaces of expected contact. Ceramics typically sputter coated onto substrates are well-known for their hardness, but also for their brittleness and opacity. When ceramic nanoparticles are utilized, transparency may be obtained. Dispersions of ceramic nanoparticles may lead to abrasion resistant nanocomposites, but only when stable high quality dispersions are formulated. Covalent inorganic-organic network structures are included in the present invention.

The resinous coating may be removed from the substrate by any method known by those skilled in the art. For example, the coatings may be removed by chemical dissolution of the substrate, mechanical removal wherein said polymer and said substrate exhibit a broad range in coefficient of thermal expansions, by subambient removal wherein said polymer and said substrate exhibit a broad range in coefficient of thermal expansions, by using a chemical adhesive primer, by using heat, and by using energy via UV or IR irradiation.

The methods of the present invention may be used to fabricate nanocomposite films that may be used as electrically conducting electrodes, thermally conducting materials, optically reflecting material, strain sensors, and an flexible electrical interconnect. Furthermore, the nanocomposite films produced by the methodologies of the present invention may retain properties that are intrinsic to the type of nanoparticle used. For example, the nanocomposite films constructed using the methodologies of the present invention may have the material properties as reflected in Table 1.

TABLE 1

| Property | Maximum Value | Minimum Value |
|---|---|---|
| Young's modulus | 200 MPa | 0.01 MPa |
| Electrical bulk conductivity | $7 \times 10^6 \, \Omega^{-1} m^{-1}$ | $1 \times 10^{-3} \, \Omega^{-1} m^{-1}$ |
| Electrical sheet resistance | 200 Ω per square | 0.1 Ω per square |
| Thermal conductivity | 100 W/m °K | 0.1 W/m °K |

There is no specific limitation on the species of nanoparticles to be used by the methodologies or in the films or decals of the present invention. Generally, examples of nanoparticles include those comprising metals, metal oxides, inorganic materials, organic materials, or mixtures thereof, all of which may have arbitrary shapes. For example, this material can be a metal such as gold, silver, palladium, or copper, a semiconductor such as an elemental semiconductor (such as silicon or germanium) or a compound semiconductor (such as GaAs or CdS), a metal compound such as titanium oxide, tin oxide, or another metal oxide, or a chalcogenide, or another known substance. The size of the nanoparticles used by the present invention may be in a range of about 1 nm to about 1000 nm. The nanoparticles may be uniformly or spatially dispersed through the self-assembled film.

The nanocomposite films of the present invention are constructed by depositing a plurality of alternating layers onto a substrate. In one embodiment, the alternating layers comprise a nanoparticle layer and a crosslinker layer. In an alternate embodiment, a polymer layer may be included in the nanocomposite film. The polymer layer may be deposited onto the nanoparticle layer and/or the crosslinker layer. This layering process of the present invention may be repeated until the desired film thickness is achieved. In a particular embodiment, nanocomposite films may be generated using the methods of the present invention having a thickness in the range of about 10 µm to about 100 nm.

The nanoparticles used in the present invention need not be spherical or even essentially spherical. The nanoparticles used in the present invention may have a wide variety of shapes. For example, such particles may have the form of ellipsoids, which may have all three principal axes of differing lengths, or may be oblate or prolate ellipsoids of revolution. The nanoparticles may alternatively be laminar in form, the term "laminar" being used herein in a broad sense to indicate bodies in which the maximum dimension along one axis is substantially less than the maximum dimension along each of the other two axes; thus, such laminar nanoparticles may have a form similar to the tabular silver halide grains well known in photographic films. The nanoparticles may also have the form of frusta of pyramids or cones, or of elongate rods. Finally, the nanoparticles may be irregular in shape.

The polymer of the present invention may comprise organosilane compounds. There are no special limitations on the organosilane compounds of the present invention. The organosilane compounds include compounds having alkyl and alkoxide groups in one molecule such as hexyltrimethoxysilane, octyltrimethoxysilane, cyclopentyltrimethoxysilane and cyclohexyltrimethoxysilane; organosilane compounds having vinyl and alkoxide groups in one molecule such as vinyltrimethoxysilane; organosilane compounds having amino and alkoxide groups in one molecule such as (N,N-dimethylaminopropyl)trimethoxysilane, (N,N-diethylaminopropyl) trimethoxysilane, aminopropyltrimethoxysilane, N-(6-aminohexyl) aminopropyltrimethoxysilane, and (aminoethylaminomethyl)phenethyltrimethoxysilane; compounds having ammonium and alkoxide groups in one molecule such as N,N,N-trimethylammoniopropyltrimethoxysilane; organosilane compounds having heteroaromatic ring and alkoxide groups in one molecule such as 2-(trimethoxysilylethyl)pyridine; organosilane compounds having fluoroalkyl and alkoxide groups in one molecule such as (3,3,3-trifluoropropyl)trimethoxysilane and (decafluoro-1,1,2,2-tetrahydrooctyl) triethoxysilane; organosilane compounds having polyethyleneglycol and alkoxide groups in one molecule such as N-(triethoxysilylpropyl)-O-polyethyleneoxide-urethane; organosilane compounds having thiocyanate and alkoxide groups in one molecule such as 3-thiocyanatepropyltriethoxysilane; organosilane compounds having ether and alkoxide groups in one molecule such as 3-methoxypropyltrimethoxysilane; organosilane compounds having thiol and alkoxide groups in one molecule such as 3-mercaptopropyltrimethoxysilane; organosilane compounds having halogen atom and alkoxide groups in one molecule such as 3-iodopropyltrimethoxysilane and 3-bromo-propyltrimethoxysilane; organosilane compounds having epoxy and alkoxide groups in one molecule such as 5,5-epoxyhexyl-triethoxysilane; organosilane compounds having sulfide and alkoxide groups in one molecule such as bis[3-(triethoxysilyl)-propyl]tetrasulfide; organosilane compounds having hydroxyl, amino and alkoxide groups such as bis(2-hydroxyethyl)-3-amino-propyltriethoxysilane; organosilane compounds having an amino group and groups derived by hydrolysis of alkoxide groups in one molecule such as aminopropylsilane triol; organosilane compounds having alkyl group and chlorine atoms in one molecule such as octyltrichlorosilane, cyclotetramethylenedi-chlorosilane, (cyclohexylmethyl))trichlorosilane,cyclohexyl-trichlorosilane, and tert-butyltrichlorosilane; organosilane compounds having fluoroalkyl group and chlorine atoms in one molecule such as (decafluoro-1,1,2,2-tetrahydrooctyl)tri-chlorosilane and (3,3,3-trifluoropropyl)trichlorosilane; organosilane compounds having heteroaromatic ring and chlorine atoms in one molecule such as 2-[2-(trichlorosilyl)-ethyl]pyridine; and organosilane compounds having an aromatic ring and chlorine atoms in one molecule such as phenethyltrichlorosilane.

The crosslinkers of the present invention are molecules that comprise at least one functional group that is capable of covalently or noncovalently binding to the desired molecule, such as the nanoparticle or polymer. The crosslinker provides bonding capabilities that may lead to complex formation. The crosslinker may include more than two functional groups. The frame of the linker supporting the functional group may be inorganic or organic. The frame may comprise silyl and/or siloxy moieties, linear or branched carbon chains, cyclical carbon moieties, saturated carbon moieties, unsaturated carbon moieties, aromatic carbon units, halogenated carbon groups and combinations thereof. U.S. Pat. No. 5,494,949. Additionally, the structure of the linker may be selected to yield desirable properties of the composite. For example, the size of the linker may be a control parameter that may affect the periodicity of the composite and the self-organization properties.

The nanoparticles may be deposited onto the substrate by the LbL CSA and RSA methodology as described in the present invention or by printing method. "Printing" is intended to include all forms of printing and coating, including, but without limitation: pre-metered coatings such as patch die coating, slot or extrusion coating, slide or cascade coating, and curtain coating; roll coating such as knife over roll coating, forward and reverse roll coating; gravure coating; dip coating; spray coating; meniscus coating; spin coating: brush coating; air knife coating; silk screen printing processes; electrostatic printing processes; thermal printing processes; ink jet printing processes; and other similar techniques. Thus, the resulting films or decals of the present invention may be flexible.

The resins of the present invention may include thermosetting resins, photosetting resins, and other resins that are uncured, undergo curing reactions or are partially uncured, but specific examples are phenolformaldehyde and other such phenol resins, epoxy resins, and polysiloxane resins. In a particular embodiment, the resin comprises a poly(etherurethane) resin.

The methods of the present invention described above may be used to form coatings on substrates of arbitrary material type, size and shape. The constitutive properties (electrical and thermal conductivity, magnetic permeability, optical/electromagnetic permittivity, mechanical modulus, abrasion resistance and hardness, nonlinear optical properties, piezoelectric and electrostrictive properties) may be controlled via the incorporated nanoclusters and molecules. Films and coatings deposited onto substrates may be uniform across the surface, patterned laterally parallel to the plane of the surface, or graded in thickness perpendicular to the surface through multiple layers. Such films may be used to impart new properties to existing substrates or materials that do not have the properties of such surface coatings.

Additionally, CAT method of the present invention may be used to form detachable free-standing thin or thick films having the same range of physical properties. Such free-standing films may be used as flexible and conformal decal and attached to other substrates, to impart functionality to that substrate. The decal may be used as a sign, marker or label. It may be used as a protective film or bandage, or a bioactive material to prevent bacterial growth. Transparent bioactive (specifically silver nanocluster-based films) and protective flexible bandages may be used to monitor wound healing without bandage removal. The free-standing films may be used as thermally conductive layers and packaging, or as plies in multilayer composites built up by stacking multiple different free-standing layers, then consolidating the stack into a final material.

The invention has been disclosed broadly and illustrated in reference to representative embodiments described above. Those skilled in the art will recognize that various modifications can be made to the present invention without departing from the spirit and scope thereof.

Without further elaboration, it is believed that one skilled in the art, using the preceding description, can utilize the present invention to the fullest extent. The following examples are illustrative only, and not limiting of the remainder of the disclosure in any way whatsoever.

EXAMPLES

Example 1

Resins for Reaction with Self Assembled Nanoparticles

A series of polysiloxanes were synthesized that contain both a controlled number of reactive sites available for both bonding to ceramic (e.g. $Al_2O_3$) nanoparticles and for crosslinking reactions. Novel polysiloxanes offer excellent weatherability including degradation resistance against ozone and UV. Lower stress adhesive nanocomposites based on polysiloxanes also minimize debonding affects that result when bonding substrates with highly mismatched coefficients of thermal expansion. Polyorganosiloxanes are also known for their high flexibility over a wide service temperature range. Such networks would remain flexible under cryogenic conditions and perform consistently mechanically above 250° C. Polyorganosiloxanes with pendent quaternized phosphine, phosphine oxide, and nitrile moieties are known to complex with oxide and metal nanoparticles with hydroxyl rich surfaces.

Polysioxanes with pendent carboxylic acid moieties and condensation sites were also prepared that may covalently bond with hydroxyl rich metal and oxide nanoparticles, specifically $Al_2O_3$. A series of cationic (quaternized phosphonium ion containing polyorganosiloxanes) and anionic (carboxylate containing polyorganosioxanes) were prepared to participate in self assembly processes with $Al_2O_3$. Polysiloxane based ionomers were used to form ultrathin crosslinked hard coats (nm scale) via electrostatic self assembly. Such materials, having controlled amounts of vinyl groups along the backbone are crosslinked with a silane crosslinking reagent (tetrakis(dimethylsiloxy)silane) in the presence a Pt catalyst to form hard abrasion resistant coatings.

Abrasion resistant hard coating decals have been developed based on polyurethane matrices. Polyurethanes are very strongly hydrogen bonding segmented copolymers capable of effectively dispersing ceramic nanoparticle such as $Al_2O_3$. This system results in μm-mm thick coatings with high impact resistance properties. The polyurethane nanocomposites are comprised of prepolymers, $Al_2O_3$, $ZrO_2$, and other additives to protect the coatings from electrostatic discharge while offering abrasion and impact resistance which function as one step multifunctional coatings.

Figure 4:
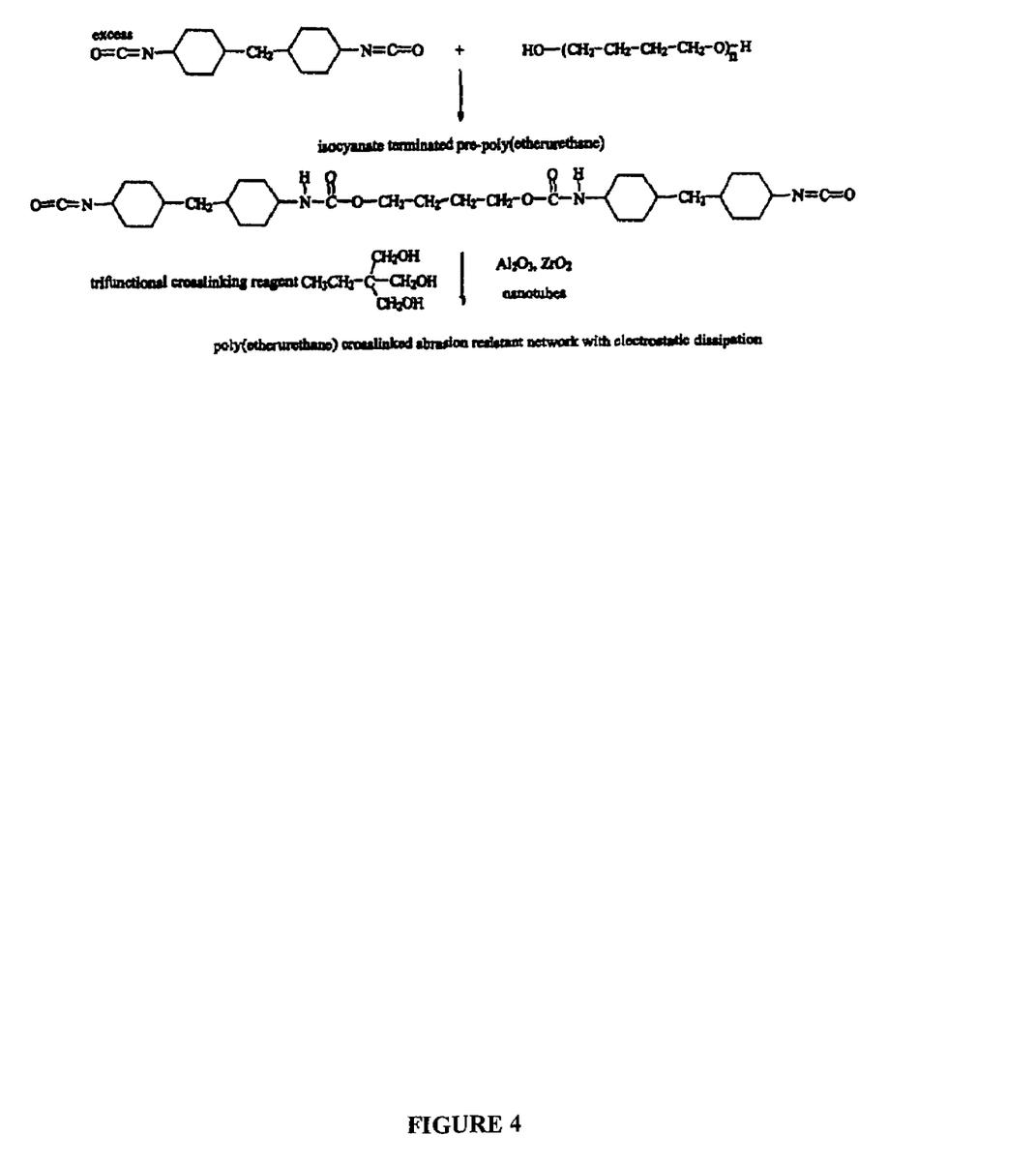
FIG. 4 illustrates the synthesis of a poly(etherurethane) transparent abrasion and impact resistant thick network with electrostatic dissipation.

The polyurethane nanocomposite matrices are formed by the reaction of diisocyanate reagents with polyol reactive oligomers. Polyurethane ionomers are formed when one of the reactive components contain ionic moieties. When reagents with a functionality of about 3 or greater are reacted, crosslinked polyurethane networks are obtained. Both polyesterurethanes and polyetherurethanes are of interest as transparent impact resistant coatings. Independent polyesterurethanes are known to yield harder coatings than polyetherurethanes. Although, importantly, polyetherurethanes offer 1) greater high temperature hydrolytic stability and 2) lower processing viscosities. A particular example of a polyetherurethanes follows. Hexamethylene-1,6-diisocyanate (HMDI) is reacted with poly(tetramethylene oxide)diol to form oligomeric prepolymers which are further reacted with trimethylol propane to yield the polyetherurethane network (FIG. 4).

The first step towards the introduction of the hard coating resin involves the reaction of an amphiphilic crosslinking reagent with the nanoparticle (e.g. Au) coating. For example, the thiol moiety of a crosslinking reagent bonds strongly with Au nanoparticles at the surface leaving amine moieties available for reactions with the isocyanate. Functionalization reactions are verified via X-Ray Photoelectron Spectroscopy (XPS). The chemical bonding preferences of thiol-Au is well documented. Similarly, alumina nanoparticles are covered with hydroxyl moieties that the HMDI present in the resin formulation of the inorganic-organic hybrid nanocomposite.

Surface preparation of the outermost conductive layer is designed to yield the strongest adhesion at the nanoparticle/polyurethane interface. Adhesion strength is confirmed via nano-indentation scratching experiments. One objective for this example is to convert the outermost layer of the gold surface to an amine rich surface. Amino functional groups will react with isocyanates to yield the urea linkage, a much stronger hydrogen bonding moiety (relative to urethane) to yield a very strong adhesive bond that prevents 1) delamination and 2) chemical integration of the nanoparticle self assembled layers. It should be noted that a diamine reagent could be used in place of the polyol above, although viscosity increases severely limiting practical processing conditions.

Figure 5:
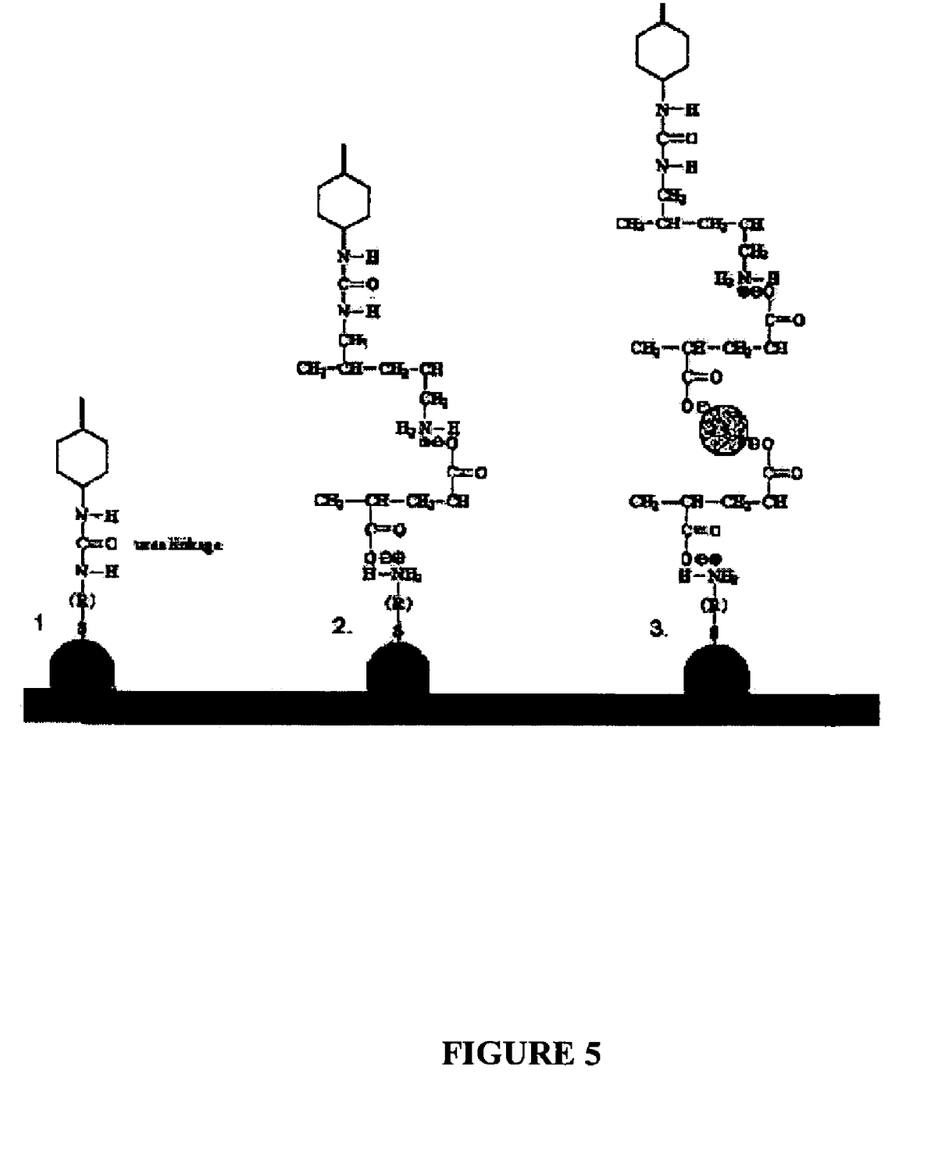
FIG. 5 shows three surface preparations to provide adhesions at the gold/poly(etherurethane) interface.

The first example of surface preparation involves use of an amine-thiol functional crosslinking reagent followed by deposition of the poly(etherurethane) hard coat (FIG. 5). A second method involves deposition of an amine-thiol crosslinker followed by a bilayer of poly(acrylic acid) and poly(allylamine hydrochloride), and finally the addition of the poly(etherurethane) hard coat (FIG. 5). The third surface preparation is a four step procedure that imparts additional alumina into the hardcoat (FIG. 5). This method begins with an amine/thiol crosslinking reagent, followed by an aqueous bilayer poly(acrylic acid)/$Al_2O_3$, a layer of poly(allylamine), and finally the poly(etherurethane) hard coat (FIG. 5).

Example 2

Electrically Conducting Elastomeric Material

The formation of a free-standing, mechanically robust, low modulus, electrically-conducting material is described in this example. This material comprised gold nanoparticles, a poly(etherurethane)polymer, mercaptoethanol as the crosslinker, 3-mercaprtopropyltriethoxysilane as the primer and polycarbonate as the substrate.

Following functionalizing the substrate with 3-mercaptopropyltriethoxysilane, the functionalized substrate was (1) immersed into a naked colloidal gold solution for approximately 1 to 120 minutes (preferable 60 minutes), rinsed in ultra pure water, (2) dipped into an aqueous solution of mercaptoethanol for approximately 1 to 30 minutes (specifically 10 minutes), rinsed in ultra pure water and (3) immersed into a poly(etherurethane)polymer solution for about 1 to 120 minutes (specifically 60 minutes), rinsed and then dried. The sequential immersion was repeated until a buildup of 52 bilayers and a material thickness of 200 µm was produced.

The material produced in this example, exhibited the following set of properties: electrical sheet resistance 10 Ω per square, and Young's modulus 20 MPa. This electrical conductivity is similar to that of metals, and the modulus is similar to that of a stiff elastomer.

Example 3

Thermally Conductive Elastomeric Material

The formation of a free-standing, mechanically robust, low modulus thermally-conducting material is described in this example. The fabrication of this material followed the approach as described in Example 1. This material comprised silver nanoparticles and poly(dimethyl-co-methylhydrido-co-3-cyanopropryl,methyl)siloxane as the polymer.

First the polycarbonate substrate was functionalized by immersing the substrate in a solution containing 3-aminopropyltrimethoxysilane. Next, the functionalized substrate was immersed into a colloid silver solution for approximately 1 to 120 minutes (specifically 60 minutes), rinsed in ultra pure water, and then dipped into a poly(dimethyl-co-methylhydrido-co-3-cyanopropryl,methyl)siloxane solution for approximately 1 to 120 minutes (specifically 60 minutes), rinsed in ultra-pure water and then dried. This immersion cycle was repeated until a buildup of 31 bilayers and a material thickness of about 300 µm was reached.

The material generated in this example has the following nominal set of properties: thermal conductivity 2 W/m ° K, and Young's modulus 0.2 MPa. This thermal conductivity is similar to that of some ceramics, and the modulus and mass density are similar to those of a stiff elastomer.

Example 4

Reflective Elastomeric Material

A free-standing, mechanically robust, low modulus reflecting material is described in this example. Due to the incorporation of metal nanoclusters into the materials, and the very low surface roughness, high reflectivity with very low distortion was demonstrated in the visible portion of the optical spectrum, nominally 400-700 nm, as well as at radio frequencies.

Following functionalizing the substrate with 3-mercaptopropyltriethoxysilane, the functionalized substrate was (1) immersed into a gold solution for approximately 1 to 120 minutes (specifically 60 minutes), rinsed in ultra pure water, (2) dipped into an aqueous solution of mercaptoethanol for approximately 1 to 30 minutes (specifically 10 minutes), rinsed in ultra pure water and dried and (3) immersed into a poly(etherurethane)polymer solution for approximately 1 to 120 minutes (specifically 60 minutes) rinsed and then dried. The sequential immersion was repeated until a buildup of 102 bilayers and a material thickness of 500 µm was produced.

The material formed in this example exhibited the following nominal set of properties: optical reflection coefficient of approximately 65% at 633 nm wavelength, and Young's modulus 10 MPa. This optical reflection coefficient is similar to that of specular metal surfaces, and the modulus is similar to those of a stiff elastomer.

Example 5

Electrically Conductive Elastomeric Sensor Material

A free-standing mechanically robust, low modulus electrically-conducting material is described in this example. This material is similar to the material produced in Example 2, but the material in this example has a concentration of metal nanoparticle low enough that deformation causes the resistivity of the material to increase.

Following functionalizing the polycarbonate substrate with 3-mercaptopropyltriethoxysilane, the functionalized polycarbonate substrate was (1) immersed into a gold solution for approximately 1 to 120 minutes (specifically 60 minutes), rinsed in ultra pure water, (2) dipped into an aqueous solution of mercaptoethanol for approximately 1 to 30 minutes (specifically 10 minutes), rinsed in ultra pure water and dried and (3) immersed into a poly(etherurethane)polymer solution for approximately 1 to 120 minutes (specifically 60 minutes), rinsed and then dried. The sequential immersion was repeated until a buildup of 41 bilayers and a material thickness of about 200 µm was produced.

The material formed in this example exhibited the following nominal set of properties: electrical sheet resistance 10 Ω per square, and Young's modulus 20 MPa. This electrical conductivity is similar to that of metals, and the modulus is similar to that of a stiff elastomer.

Figure 6:
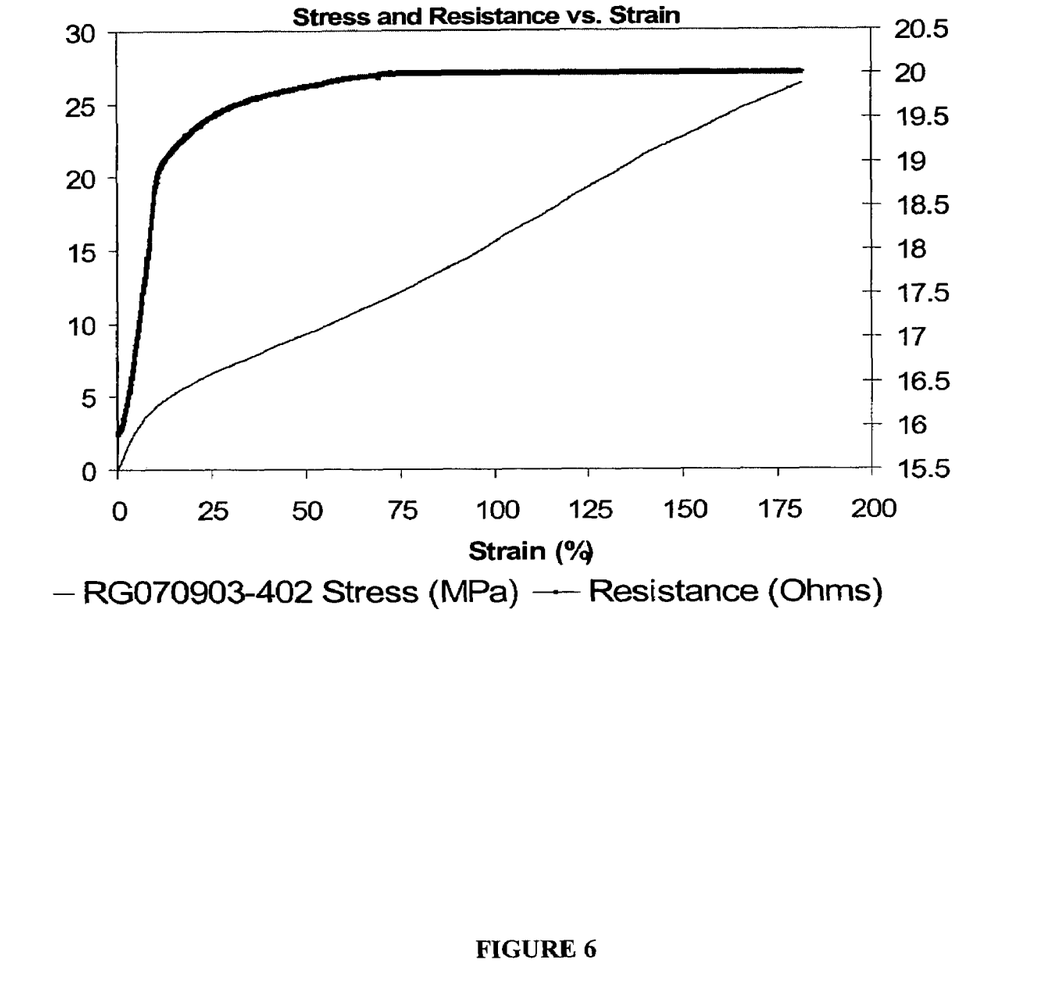
FIG. 6 shows the change in electrical resistance when the free standing, mechanically robust, low modulus electrically conducting material is mechanically strained.

If such a material is mechanically strained, the electrical resistance changes as shown in FIG. 6. Such materials may thus be used as strain sensors. Notably, this behavior is markedly different from that of conventional strain gauge sensors that are based on the Poisson effect in strained metals.

As a second example of this type of performance, a material was formed and its end-to-end resistance measured as 1.5 ohms. The material was then mechanically loaded to 50% elongation (strain of 50%) and its resistance was measured as 56 ohms. Upon release of the mechanical load, the resistance returned to 1.5 ohms.

Example 6

Electrically Conducting Elastomeric Material Used as a Flexible Interconnect or Wiring A free-standing, mechanically robust, low modulus electrically-conducting material used for flexible electrical interconnections is described in this example. This material is comprised of gold nanoparticles, polyurethanse as the polymer, and mercaptoethanol as the crosslinker.

Following functionalizing the polycarbonate substrate with 3-aminopropyltriethoxysilane, the functionalized polycarbonate substrate was (1) immersed into a gold solution for approximately 1 to 120 minutes (specifically 60 minutes), rinsed in ultra pure water, (2) dipped into an aqueous solution of mercaptoethanol for approximately 1 to 30 minutes (specifically 10 minutes), rinsed in ultra pure water and (3) immersed into a poly(etherurethane) solution for approximately 1 to 120 minutes (specifically 60 minutes), rinsed and then dried. The sequential immersion was repeated until a buildup of 31 bilayers and a material thickness of about 50 μm was produced.

The material fabricated in this example exhibited properties around nominal values of electrical sheet resistance 10 Ω per square, and Young's modulus 100 MPa. This allows the realization of flexible electrically conducting interconnects and networks that can be mechanically displaced or strained to strains up to 100%. Typical "flex circuit" interconnects fabricated using other manufacturing approaches allow strains on the order of a few percent prior to their mechanical and associated electrical failure.

Various modifications and variations of the described methods and systems of the invention will be apparent to those skilled in the art without departing from the scope and spirit of the invention. Although the invention has been described in connection with specific preferred embodiments, it should be understood that the invention as claimed should not be unduly limited to such specific embodiments. Indeed, various modifications of the described modes for carrying out the invention which are obvious to those skilled in molecular biology or related fields are intended to be within the scope of the following claims.

The disclosures of all references and publications cited above are expressly incorporated by reference in their entireties to the same extent as if each were incorporated by reference individually.

We claim:

1. A method for producing a nanocomposite film, said method comprising the steps of:
   contacting a substrate with at least one nanoparticle species by immersing the substrate in a solution containing the at least one nanoparticle species to form a nanoparticle layer on the substrate, wherein said at least one nanoparticle species comprises gold;
   contacting the nanoparticle-layered substrate with at least one polymer by immersing the nanoparticle-layered substrate into a solution containing the at least one polymer to form a polymer layer on the nanoparticle-layered substrate to form an elastomeric film on the substrate, wherein said at least one polymer comprises poly(urethane)-co-(siloxane);
   contacting the surface of elastomeric film with a resin; and
   treating the resin on the nanocomposite film to form an abrasion resistant matrix on the nanocomposite film.

2. The method of claim 1, further comprising the step of removing the resin-coated nanocomposite film from the substrate to produce a free-standing resin-coated nanocomposite film.

3. The method of claim 1, wherein the nanocomposite film is functionalized by contacting a surface of the nanocomposite film with a crosslinker.

4. The method of claim 1, wherein the resin in said resin contacting step is an abrasion resistant resin selected from the group consisting of thermosetting resins, photosetting resins, phenlformaldehyde, phenol resins, epoxy resins, polysiloxane resins, polyurethane, and poly(etherurethane) resins.

5. The method of claim 1, wherein said resin contacting step comprises applying the resin by a method selected from the group consisting of spin coating, spraying, web-based processes, ink jet printing, and a combination thereof.

6. The method of claim 1, wherein said treating step comprises heating the resin on the nanocomposite film.

7. The method of claim 1, wherein said treating step comprises irradiating the resin with at least one of infrared light, UV light or visible light.

8. The method of claim 1, wherein said treating step comprises drying the resin.

9. The method of claim 1, wherein the resin in said resin contacting step forms a transparent coating.

10. The method of claim 1, wherein the nanoparticles in the nanoparticles layer are covalently integrated with the resin to form an abrasion resistant coating.

11. The method of claim 2, wherein said removing step comprises removing the resin-coated nanocomposite film from the substrate by a method selected from the groups consisting of chemical dissolution of the substrate, mechanical removal, subambient removal, heating, irradiating with UV light, irradiating with infrared light, irradiating with visible light, and a combination thereof.

12. The method of claim 1, further comprising the step of forming at least one crosslinker layer by contacting at least one of the substrate, the nanoparticle layer or the polymer layer with at least one crosslinker species to form a crosslinker layer.

13. The method of claim 12, wherein the at least one crosslinker layer has at least two functional groups selected from the group consisting of hydroxyl groups, amino groups, carboxyl groups, carboxylic acid anhydride groups, mercapto groups, hydrosilicon groups and a combination thereof.

14. The method of claim 12, wherein the crosslinker layer comprises mercaptoethanol.

15. The method of claim 1, further comprising the step of functionalizing the substrate with a polymer.

16. The method of claim 1, wherein the nanoparticle in said substrate contacting step is selected from the group consisting of metallic nanoparticles, semiconducting nanoparticles, magnetic nanoparticles, ceramic nanoparticles, and dielectric nanoparticles, and a combination thereof.

17. The method of claim 1, wherein the substrate in said substrate contacting step is selected from the group consisting of a glass slide, single crystal silicon, polycarbonate, kapton, polyethylene rigid polymer materials, flexible polymer materials, ceramics, metal surfaces, etched surfaces, functionalized surfaces, and non-functionalized surfaces.

18. The method of claim 1, wherein the nanoparticle species has a diameter in the range of about 1 nm to about 1000 nm.

* * * * *